(12) United States Patent
Easwaran et al.

(10) Patent No.: US 10,804,691 B2
(45) Date of Patent: Oct. 13, 2020

(54) CIRCUIT PROVIDING REVERSE CURRENT PROTECTION FOR HIGH-SIDE DRIVER

(71) Applicant: Texas Instruments Incorporated, Dallas, TX (US)

(72) Inventors: Sri Navaneethakrishnan Easwaran, Plano, TX (US); Timothy Paul Duryea, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 403 days.

(21) Appl. No.: 15/913,465

(22) Filed: Mar. 6, 2018

(65) Prior Publication Data

US 2019/0280472 A1    Sep. 12, 2019

(51) Int. Cl.
*H02H 3/00*        (2006.01)
*H03K 17/687*    (2006.01)
*H04B 1/40*        (2015.01)
*H03F 3/45*        (2006.01)

(52) U.S. Cl.
CPC .......... *H02H 3/00* (2013.01); *H03K 17/687* (2013.01); *H03F 3/45475* (2013.01); *H03K 2217/0063* (2013.01); *H04B 1/40* (2013.01)

(58) Field of Classification Search
CPC ................................. H02H 3/00; H03K 17/687
See application file for complete search history.

(56) References Cited

U.S. PATENT DOCUMENTS

| | | | | |
|---|---|---|---|---|
| 5,627,460 | A * | 5/1997 | Bazinet | G05F 1/618 323/224 |
| 5,789,951 | A * | 8/1998 | Shen | H03K 17/0828 327/110 |
| 2014/0241414 | A1 * | 8/2014 | Reidl | H04L 25/4904 375/238 |
| 2016/0109932 | A1 | 4/2016 | Jeon | |
| 2016/0226454 | A1 | 8/2016 | Mastantuono | |
| 2016/0231799 | A1 * | 8/2016 | Birnie | G06F 1/28 |
| 2017/0337111 | A1 * | 11/2017 | Kalisch | G06F 11/27 |

(Continued)

FOREIGN PATENT DOCUMENTS

| | | |
|---|---|---|
| WO | 2010126491 A1 | 11/2010 |
| WO | 2017027589 A1 | 2/2017 |

OTHER PUBLICATIONS

International Search Report dated May 30, 2019.

*Primary Examiner* — Scott Bauer

(74) *Attorney, Agent, or Firm* — Lawrence J. Basuk; Charles A. Brill; Frank D. Cimino

(57) ABSTRACT

An electronic control unit (ECU) operates between first and second voltage rails and includes an amplifier circuit and a single current sense circuit coupled to carry a signal to a bus pin and to protect the bus pin from both a short to ground and a short to battery. The single current sense circuit includes a switch circuit that passes the signal to the bus pin and a forward current sensing circuit that provides a second current that is proportional to an output current at the bus pin. The forward current sensing circuit causes the second current to be substantially zero when voltage on the bus pin is above a given value. The single current sense circuit also includes a forward current protection circuit and a reverse current switching circuit that receives the second current and closes a connection to the second voltage when the second current is zero.

17 Claims, 6 Drawing Sheets

(56) References Cited

U.S. PATENT DOCUMENTS

2018/0209820 A1\* 7/2018 Hammerschmidt ......................... G01D 5/2454
2019/0334511 A1\* 10/2019 Eggermont .............. H03K 4/00

\* cited by examiner

CIRCUIT PROVIDING REVERSE CURRENT PROTECTION FOR HIGH-SIDE DRIVER

FIELD OF THE DISCLOSURE

Disclosed embodiments relate generally to the field of electronic circuits. More particularly, and not by way of any limitation, the present disclosure is directed to a circuit providing reverse current protection for a high-side driver.

BACKGROUND

Peripheral Sensor Interface (PSI) is an evolving automotive standard, of which PSI5 is a current version, and is considered a replacement for Local Interconnect Network (LIN). A number of automotive applications utilize the PSI protocol, such as airbag acceleration sensors, ultra sound, power train, braking applications etc. An electronic control unit (ECU) in a PSI transceiver supplies power, e.g., a base voltage, and a synchronization (SYNC) pulse, to a sensor, with the SYNC pulse initiating data collection from the sensor. The sensor in turn responds with current-modulated data, which the ECU senses and converts to a digital waveform. The transceiver bus pin (OUTx) can get shorted to either ground or the battery and requires bi-directional current sensing for fault protection. Protection for a short to ground and a short to battery has traditionally utilized two different circuits, which leads to both increased area and increased power consumption for the chip, as will be explained below. A smaller footprint and lower power consumption for the protection circuit is desired.

SUMMARY

Disclosed embodiments provide a single current sense path for both short to ground and short to battery protection, eliminating the use of two or more current sense loops to provide both protections. This in turn provides efficiency in both area required for the circuit and in power needed to operate the circuit. Other advantages may also be provided, as will be discussed below.

In one aspect, an embodiment of an electronic control unit (ECU) for a high-side driver is disclosed. The ECU comprises an amplifier circuit comprising a first switching transistor coupled in series with a second switching transistor between a first voltage rail that carries a first voltage and a second voltage rail that carries a second voltage that is less than the first voltage, the amplifier circuit being coupled to control respective gates of the first and second switching transistors; and a single current sense circuit coupled to protect a bus pin on the high-side driver from both a short to ground and a short to battery, the single current sense circuit comprising: an input node located between the first switching transistor and the second switching transistor; a switch circuit coupled to pass a current from the input node to the bus pin during normal operation; a forward current sensing circuit coupled to the input node and to the first voltage rail, the forward current sensing circuit being coupled to provide a first current on a first output node and a second current on a second output node, each of the first and second currents being proportional to an output current at the bus pin, wherein the first and second currents are substantially zero when a bus voltage on the bus pin is above a given value; a reverse current switching circuit coupled to receive the second current and further coupled to the gate of the second switching transistor, the reverse current switching circuit being coupled to turn the second switching transistor OFF when the second current output is zero; and a forward current protection circuit coupled to the forward current sensing circuit, to the first voltage rail and to a third voltage rail that provides a third voltage that is less than the second voltage, the forward current protection circuit being further coupled to turn OFF the switch circuit responsive to a short to ground.

In another aspect, an embodiment of a transceiver chip is disclosed. The transceiver chip comprises a plurality of decoders; and a plurality of transceivers, each of the plurality of transceivers being coupled to a respective decoder of the plurality of decoders via a respective channel, a transceiver of the plurality of transceivers comprising an electronic control unit (ECU) for a high-side driver, the ECU comprising: an amplifier circuit comprising a first switching transistor coupled in series with a second switching transistor between a first voltage rail and a second voltage rail, the amplifier circuit being coupled to control respective gates of the first and second switching transistors; and a single current sense circuit coupled to protect a bus pin on the ECU from both a short to ground and a short to battery, the single current sense circuit comprising: an input node located between the first switching transistor and the second switching transistor; a switch circuit coupled to pass a current from the input node to the bus pin during normal operation; a forward current sensing circuit coupled to the input node and to the first voltage rail, the forward current sensing circuit being coupled to provide a first current on a first output node and a second current on a second output node, each of the first and second currents being proportional to an output current at the bus pin, wherein the first and second currents are substantially zero when a bus voltage on the bus pin is above a selected value; a reverse current switching circuit coupled to receive the second current and further coupled to the gate of the second switching transistor, the reverse current switching circuit being coupled to turn the second switching transistor OFF when the second current is zero; and a forward current protection circuit coupled to the forward current sensing circuit, to the first voltage rail and to a third voltage rail, the forward current protection circuit being further coupled to turn OFF the switch circuit responsive to a short to ground.

In yet another aspect, an embodiment of a system-on-chip (SOC) is disclosed. The SOC comprises a power supply module coupled to provide a first voltage rail that provides a first voltage, a second voltage rail that provides a second voltage that is less than the first voltage, and a third voltage rail that provides a third voltage that is less than the second voltage; a first plurality of transceiver coupled to receive the second and the third voltage rails; and a second plurality of transceivers coupled to receive the first, the second and the third voltage rails, each of the second plurality of transceivers being coupled to a respective decoder of a plurality of decoders via a respective channel, a transceiver of the second plurality of transceivers comprising an ECU for a high-side driver, the ECU comprising: an amplifier circuit comprising a first switching transistor coupled in series with a second switching transistor between the first voltage rail and the second voltage rail, the amplifier circuit being coupled to control respective gates of the first and second switching transistors; and a single sense circuit coupled to protect a bus pin on the ECU from both a short to ground and a short to battery, the single sense circuit comprising: an input node located between the first switching transistor and the second switching transistor; a switch circuit coupled to pass a current from the input node to the bus pin during normal operation; a forward current sensing circuit coupled to the input node and to the first voltage rail, the forward current sensing circuit being coupled to provide a first current and a second current, each of the first and second currents being proportional to an output current at the bus pin, wherein the first and second currents are substantially zero when a bus voltage on the bus pin is above a selected value; a reverse current switching circuit coupled to receive the second current and further coupled to the gate of the second switching transistor, the reverse current switching circuit being coupled to turn the second switching transistor OFF when the second current is zero; and a forward current protection circuit coupled to the forward current sensing circuit, to the first voltage rail and to the third voltage rail, the forward current protection circuit being further coupled to turn OFF the switch circuit responsive to a short to ground.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 1:
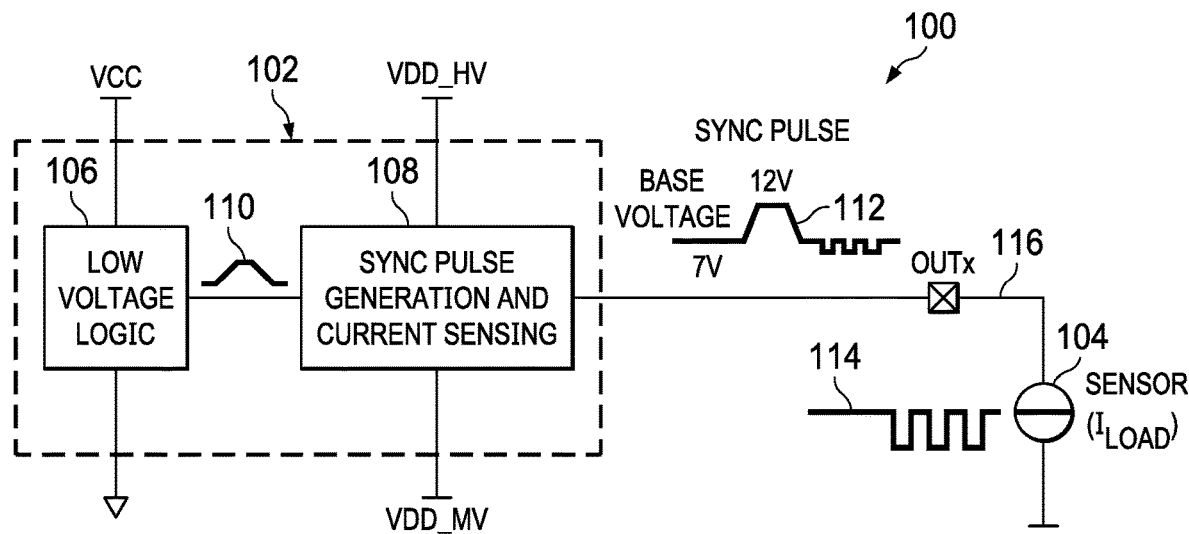
FIG. 1 depicts a high-level schematic of an ECU for a high-side driver that can utilize a sensing circuit according to an embodiment of the disclosure.

FIG. 1 depicts a high-level schematic of an automotive system 100 that includes an ECU 102 for a high-side driver and a sensor 104 that is coupled to the bus pin OUTx of the ECU through a bi-directional signal line 116. Although only one sensor is shown in this figure, typically a number of sensors are coupled to ECU 102. In one embodiment automotive system 100 is designed to operate using the PSI protocol, e.g., PSI5, although automotive system 100 can also operate under other automotive protocols. In the PSI5 protocol, bi-directional signal line 116 is a two-wire connection that provides both power to the sensors and data transmission. ECU 102 includes low voltage logic circuit 106 that operates between the rails of VCC, which can be, for example, 5 V and a local ground. ECU 102 also includes a high-voltage SYNC pulse generation and current sensing circuit 108 that operates between rails VDD_HV, which typically has a "high" voltage in the range of 14-40 V, and VDD_MV, which has a "medium" voltage that in one embodiment has a value of around 7 V.

Low voltage logic circuit 106 provides a signal 110 to SYNC pulse generation and current sensing circuit 108 that can indicate that a SYNC pulse should be provided to initiate data collection from associated sensors. SYNC pulse generation and current sensing circuit 108 provides a signal 112 on bus pin OUTx. Signal 112 will provide a base voltage of, for example, 7 V when automotive system 100 is active. Responsive to receiving a pulse on signal 110, SYNC pulse generation and current sensing circuit 108 provides a SYNC pulse, which in one embodiment is 12 V. The SYNC pulse triggers a response from sensor 104, which provides signal 114 utilizing current modulation on bi-directional signal line 116, with a "low" level represented by the normal (quiescent) current consumption of the sensors and a "high" level generated by an increased current sink of the sensor. SYNC pulse generation and current sensing circuit 108 is configured to detect the changes in current and provide a digital signal.

Figure 2:
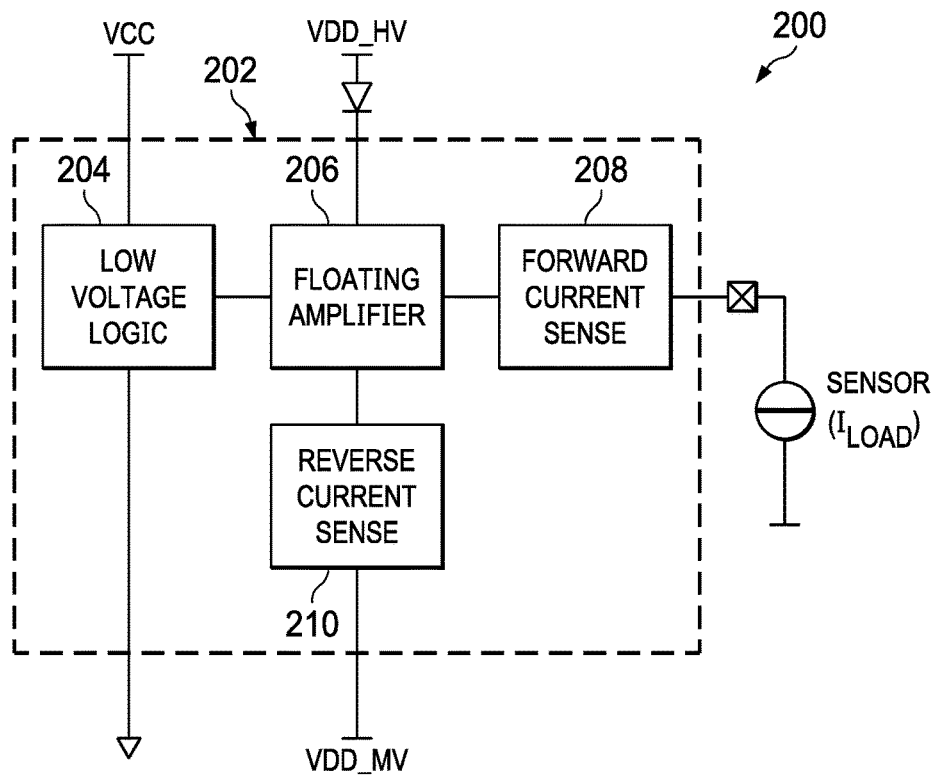
FIG. 2 depicts a somewhat more detailed schematic of an ECU for a high-side driver according to the prior art.

Bi-directional signal line 116 can run for meters through an automotive system. During the lifetime of automotive system 100, bus pin OUTx can be inadvertently shorted to either the battery or to ground, so ECU 102 must be protected when either of these conditions occurs. FIG. 2 depicts automotive system 200, which is a somewhat more detailed version of FIG. 1. ECU 202 contains low voltage logic circuit 204, amplifier circuit 206, which in this example is a floating amplifier, and two protection circuits: forward current sense circuit 208 and reverse current sense circuit 210. The use of two or more separate protection circuits is common, even though each of these circuits utilizes a large amount of real estate on a chip and requires a significant expenditure of power to run. Under the PSI5 protocol there are multiple channels per device, so that each channel requires both a forward current sense circuit and a reverse current sense circuit, each requiring a large area and each consuming current in the range of 200 μA.

Figure 3A:
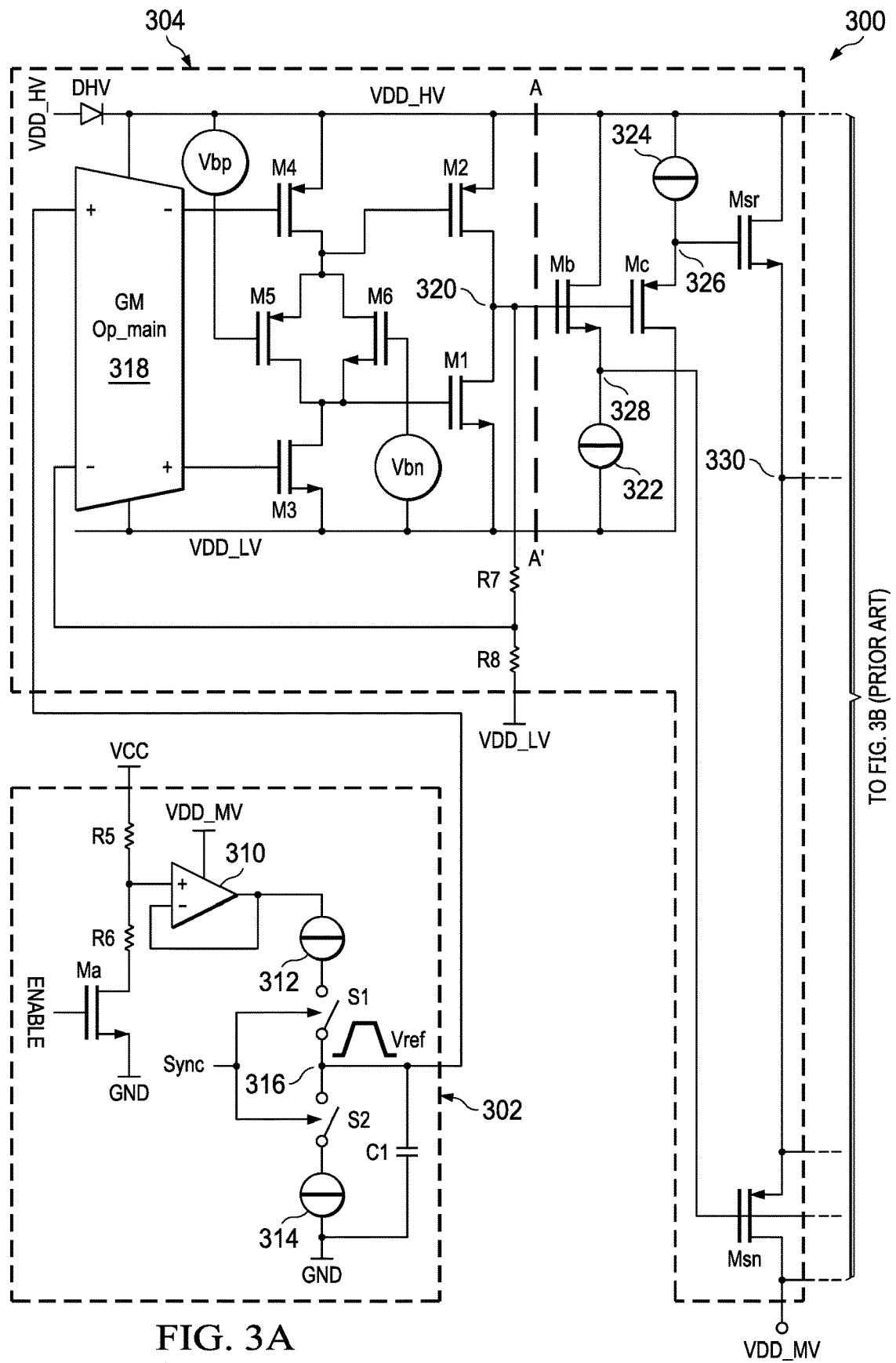
FIGS. 3A and 3B together depict an implementation of an ECU for a high-side driver according to the prior art.
Figure 3B:
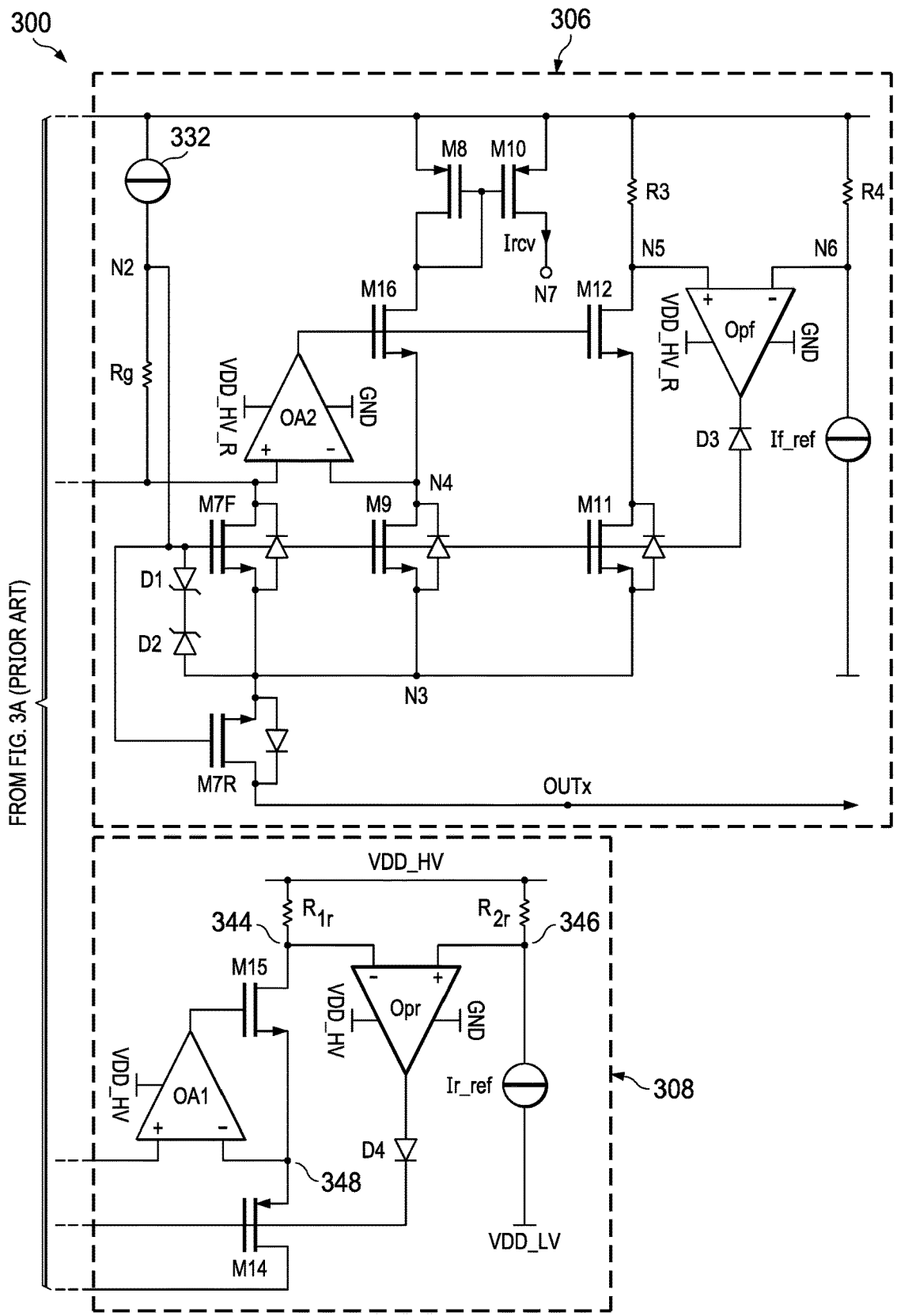

FIGS. 3A and 3B together depict an ECU 300 for a high-side driver circuit that can be utilized as ECU 202. ECU 300 contains low voltage logic circuit 302, amplifier circuit 304, which again is a floating amplifier, forward current sense circuit 306 and reverse current sense circuit 308. Low voltage logic circuit 302 contains a voltage divider that includes resistors R5 and R6 coupled in series with N-type metal oxide silicon (NMOS) transistor Ma between the upper rail and the lower rail of the low-voltage section of the circuit. NMOS transistor Ma receives an enable signal when the circuit is active. A voltage taken between resistors R5 and R6 is coupled to the non-inverting input of amplifier 310 and the output of amplifier 310 is coupled to the inverting input of amplifier 310 and also to current source 312. Current source 312 is coupled to a node 316 through a switch S1 and current sink 314 is also coupled to node 316 through a second switch S2. A synchronization signal controls switches S1, S2 so that the output of low voltage logic circuit 302 is either equal to the lower rail or a reference voltage Vref, while capacitor C1 is coupled between the output signal of low voltage logic circuit 302 and the lower rail to ensure that the signal has a sloped transition between the value of the lower rail and Vref.

The signal produced by low voltage logic circuit 302 is provided to amplifier circuit 304, which in the embodiment shown is a floating amplifier circuit that receives a high-voltage rail, VDD_HV, a medium voltage rail, VDD_MV, and a low voltage rail, VDD_LV. Voltage rails VDD_HV, VDD_MV and VDD_LV can be referred to as first, second and third voltage rails respectively. In one embodiment, high-voltage rail VDD_HV carries a first voltage of approximately 14 V, medium-voltage rail VDD_MV carries a second voltage of approximately 7 V and low-voltage rail VDD_LV carries a third voltage of local ground, also referred to as a lower voltage rail. In the embodiment shown in FIGS. 3A-3B, the need is to have a very controlled shape to the pulse produced by amplifier circuit 304 in order to avoid radio frequency (RF) interference. Because of this need, the received signal is received on the non-inverting input of pulse-shaping amplifier 318, which is coupled to each of high-voltage rail VDD_HV, medium-voltage rail VDD_MV and low-voltage rail VDD_LV. Diode DHV provides protection from current moving upstream from the circuit shown.

Pulse-shaping amplifier 318 provides an inverting output, which is coupled to the gate of P-type metal oxide silicon (PMOS) transistor M4, and a non-inverting output, which is coupled to the gate of NMOS transistor M3. PMOS transistor M4 has a source coupled to high-voltage rail VDD_HV and NMOS transistor M3 has a source coupled to low-voltage rail VDD_LV. PMOS transistor M5 and NMOS transistor M6 are coupled in parallel between the drains of PMOS transistor M4 and NMOS transistor M3, with the gate of PMOS transistor M5 coupled to high-voltage rail VDD_HV through current source Vbp and the gate of NMOS transistor M6 coupled to the low-voltage rail through current sink Vbn. PMOS transistor M2 is coupled in series with NMOS transistor M1 between VDD_HV and VDD_LV. The gate of PMOS transistor M2 is coupled to the drain of PMOS transistor M4 and the gate of NMOS transistor M1 is coupled to the drain of NMOS transistor M3. Node 320, which lies between the drains of PMOS transistor M2 and NMOS transistor M1 is coupled to drive the gates of NMOS transistor Mb and PMOS transistor Mc and is also coupled to the inverting input of pulse-shaping amplifier 318 through a voltage divider that includes resistor R7 and R8 to provide a feedback loop. NMOS transistor Mb has a source coupled to VDD_LV through current sink 322 and a drain coupled to VDD_HV; PMOS transistor Mc has a source coupled to VDD_HV through current source 324 and a drain coupled to VDD_LV. Finally, NMOS switching transistor Msr is coupled in series with PMOS switching transistor Msn between high-voltage rail VDD_HV and medium-voltage rail VDD_MV. The gate of NMOS switching transistor Msr is coupled to a node 326 between current source 324 and PMOS transistor Mc and the gate of PMOS switching transistor Msn is coupled to a node 328 between NMOS transistor Mb and current sink 322. Node 330, which lies between the sources of NMOS switching transistor Msr and PMOS switching transistor Msn, provides a signal to both forward current sense circuit 306 and reverse current sense circuit 308. During normal operation, e.g., when no short circuits are present, amplifier circuit 304 provides a base voltage that is equal to the value carried on medium-voltage rail VDD_MV to power the sensors. When amplifier circuit 304 receives a pulse on the input to pulse-shaping amplifier 318, amplifier circuit 304 provides a pulse that has a precise shape designed to minimize RF interference.

Within forward current sense circuit 306, NMOS transistors M7F and M7R are coupled in series between node 330 and bus pin OUTX. Current source 332 is coupled in series with resistor Rg between VDD_HV and node 330; and node N2 between current source 332 and resistor Rg is coupled to the gates of NMOS transistors M7F and M7R. The coupling of the gates of NMOS transistors M7F and M7R to the stable voltage on node N2 ensures that the signal received on node 330 is passed to bus pin OUTx unless NMOS transistors M7F and M7R are specifically turned OFF during a short to ground.

Also within forward current sense circuit 306, operational amplifier OA2, along with PMOS transistors M8, M10 and NMOS transistors M9, M16 perform current sensing and operational amplifier Opf, in combination with third and fourth resistors R3, R4, NMOS transistors M11, M12, diode D3 and current sink If_ref provide protection against a short to ground. The non-inverting input of operational amplifier OA2 is coupled to node 330 to receive the outgoing signal and provides its output to the gate of NMOS transistor M16. PMOS transistor M8, and NMOS transistors M16, M9 are coupled in series between the high-voltage rail VDD_HV and third node N3, which is coupled to the gates of NMOS transistors M7F, M7R through back-to-back diodes D1, D2, which can be considered a first diode and second diode respectively. Node N4, which lies between the source of NMOS transistor M16 and the drain of NMOS transistor M9 is coupled to the inverting input of operational amplifier OA2 and the gate of NMOS transistor M9 is coupled, in common with the gates of NMOS transistors M7F, M7R, to node N2. PMOS transistor M8 is diode coupled and the gate of PMOS transistor M8 is further coupled to the gate of PMOS transistor M10, which is coupled between VDD_HV and node N7, which provides a current Ircv for further processing.

Within the portion of forward current sense circuit 306 that protects against a short to ground, resistor R3 is coupled in series with NMOS transistors M12 and M11 between VDD_HV and node N3 and resistor R4 is coupled in series with current sink If_ref between VDD_HV and VDD_LV. The gate of NMOS transistor M12 is coupled to the output of operational amplifier OA2; the gate of NMOS transistor M11 is coupled to node N2; and fifth node N5 between resistor R3 and the drain of NMOS transistor M12 is coupled to the non-inverting input of operational amplifier Opf. Sixth node N6, which lies between resistor R4 and current sink If_ref is coupled to the inverting node of operational amplifier Opf and the output of operational amplifier Opf is coupled through diode D3 to node N2 and is also coupled to the gates of NMOS transistors M7F and M7R. Operation of the forward current sense circuit will be discussed with respect to FIG. 4, which contains only a few additions to this circuit.

Reverse current sense circuit 308 also contains two operational amplifiers OA1 and Opr. Additionally, reverse current sense circuit 308 includes resistor R1r, which is coupled in series with NMOS transistor M15 and PMOS transistor M14 between VDD_HV and VDD_MV, and resistor R2r, which is coupled in series with current sink Ir ref between VDD_HV and VDD_LV. The non-inverting input of operational amplifier OA1 is coupled to node 330, which provides the output signal to bus pin OUTx; the inverting input of operational amplifier OA1 is coupled to node 348, which lies between the respective sources of NMOS transistor M15 and PMOS transistor M14; and the output of operational amplifier OA1 is coupled to the gate of NMOS transistor M15. Node 344, which lies between resistor R1r and NMOS transistor M15 is coupled to the inverting node of operational amplifier Opr and node 346, which lies between resistor R2r and current sink Ir ref, is coupled to the non-inverting input of operational amplifier Ofr. The output of operational amplifier Opr is coupled through diode D4 to node 328 in common with the gates of PMOS transistors M14 and Msn. During normal operation of reverse current sense circuit 308, the voltage on node 346 is less than the voltage on node 344, causing operational amplifier Opr to output a low signal, which does not change the low value on PMOS switching transistor Msn and maintains a current through PMOS switching transistor Msn. When a short to the battery causes a reverse current to flow, operational amplifier OA1 turns ON NMOS transistor M15, which lowers the voltage on node 344, causing operational amplifier Opr to output a high signal, which acts to turn OFF PMOS switching transistor Msn, protecting current from flowing from bus pin OUTx to medium-voltage rail VDD_MV.

While ECU 300 works well, the circuit uses two separate sensing circuits to provide protection for a short to ground and a short to battery. These two sensing circuits are high-voltage and increase the area for the circuit, as well as increasing power consumption by at least 200 μA for a single PSI5 channel. For a chip or SOC with multiple channels, the power consumption is even greater. Another issue that may arise is that during a rising edge of the SYNC pulse, the cross current from high-voltage rail VDD_HV to medium-voltage rail VDD_MV may be misinterpreted as a false reverse current, inadvertently triggering the reverse current protection. One other solution to the need to protect against a short to battery can be to utilize a differential voltage comparator between bus pin OUTx and medium-voltage rail VDD_MV to sense the reverse current condition. However, this solution again significantly increases area since the differential voltage comparator must also be high-voltage.

Figure 4:
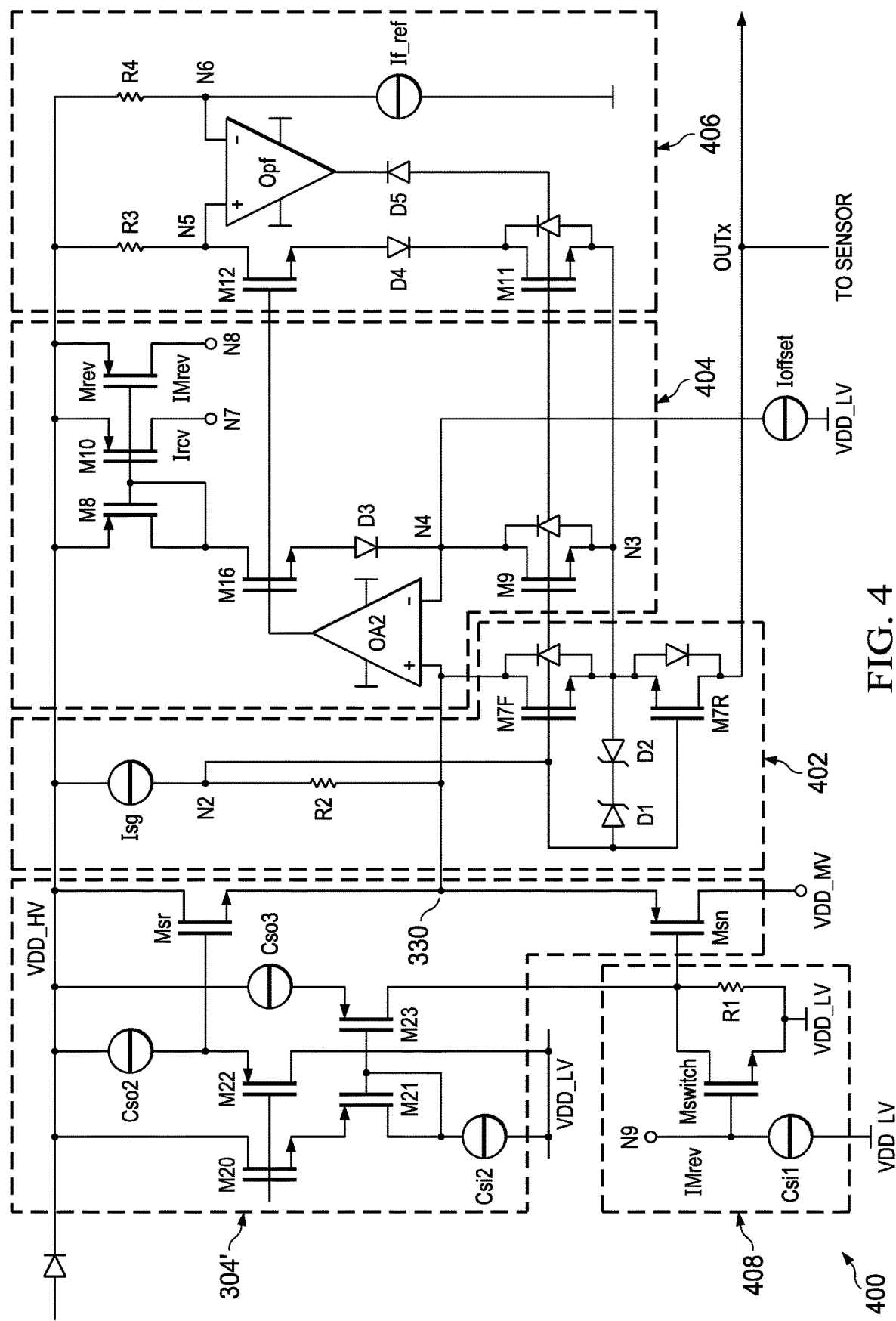
FIG. 4 depicts an implementation of a portion of an ECU for a high-side driver according to an embodiment of the disclosure.

FIG. 4 depicts a portion of an ECU 400 for a high-side driver circuit that eliminates the use of a second sensing circuit to regulate a short to battery and utilizes a single current sense circuit to protect bus pin OUTx from both a short to ground and a short to battery, i.e., to ensure that a too high or too low bus voltage on bus pin OUTx does not cause harm to the chip. In order to highlight the changes made to ECU 300, low voltage logic circuit 302 and the portions of amplifier circuit 304 to the left of line A-A' are not shown in this figure, as these circuits remain the same. The portion of amplifier circuit 304' that is shown has been modified from ECU 300 and contains eighth NMOS transistor M20 and fourth, fifth and sixth PMOS transistors M21, M22, M23, as well as second current sink Csi2 and second and third current sources Cso2 and Cso3. Eighth NMOS transistor M20 is coupled in series with PMOS transistor M21 and second current sink Csi2 between VDD_HV and VDD_LV. Second current source Cso2 is coupled in series with PMOS transistor M22 between VDD_HV and VDD_LV and third current source Cso3 is coupled in series with PMOS transistor M23. One terminal of third current source Cso3 is coupled to VDD_HV and the drain of PMOS transistor M23 coupled to the gate of PMOS switching transistor Msn, which is also referred to as a second switching transistor. The gates of PMOS transistors M21 and M23 are coupled together and to the drain of PMOS transistor M21 to form a current mirror. Finally, the gate of NMOS switching transistor Msr, which is also referred to as a first switching transistor, is coupled to a point between second current source Cso2 and PMOS transistor M22.

The single current sense circuit includes four sections, each of which is enclosed by dotted lines: 1) switch circuit 402, which includes first current source Isg, second resistor R2, first and second diodes D1 and D2 second and third NMOS transistors M7F, M7R, which have a common source, 2) forward current sensing circuit 404, which includes first operational amplifier OA2, third diode D3, fourth NMOS transistor M16, fifth NMOS transistor M9, and first, second and third PMOS transistors M8, M10, Mrev, 3) forward current protection circuit 406, which includes second operational amplifier Opf, third and fourth resistors R3, R4, fourth and fifth diodes D4, D5, third current sink If_ref, sixth NMOS transistor M12 and seventh NMOS transistor M11, and 4) reverse current switching circuit 408, which includes first current sink Csi1, first NMOS transistor Mswitch and first resistor R1 and is coupled to the gate of PMOS switching transistor Msn. In the embodiment shown, switch circuit 402, forward current sensing circuit 404 and forward current protection circuit 406 contain the same devices as do their counterpart circuits in FIGS. 3A and 3B and operate in the same manner, except for the addition of third diode D3 to forward current sensing circuit 404 between fourth and fifth NMOS transistors M16 and M9 and the addition of fourth diode D4 to forward current protection circuit 406 between sixth and seventh NMOS transistors M12 and M11. Forward current sensing circuit 404 has also been modified to include the additional PMOS transistor Mrev, whose gate is coupled to the gates of PMOS transistors M8 and M10. PMOS transistor Mrev has a source coupled to VDD_HV and a drain coupled to provide a current IMrev to reverse current switching circuit 408 via node N8.

During normal operation of ECU 400, amplifier circuit 304' provides a base voltage at node 330 by turning ON PMOS transistor Msn, providing the voltage VDD_MV. When a pulse signal is provided by amplifier circuit 304', PMOS switching transistor Msn turns OFF and NMOS switching transistor Msr turns ON to provide voltage VDD_HV. Both the amplifier circuit 304 shown in FIG. 3A and the modifications shown as amplifier circuit 304' in FIG. 4 provide a pulse that is shaped to meet specific needs of an automotive circuit, such as providing reduced noise. It will be understood, however, that other amplifier circuits can be utilized with the single sensing circuit disclosed herein. The disclosed single sensing circuit is shown being utilized with a floating amplifier circuit, but the disclosed single sensing circuit can also be utilized with an amplifier circuit that is not floating.

The output signal, i.e., the base voltage and/or SYNC pulse, is passed from node 330, which is also referred to as an input node, to bus pin OUTx through switch circuit 402. The gates of second and third NMOS transistors M7F, M7R are coupled to a stable voltage provided at second node N2 that holds second and third NMOS transistors M7F, M7R fully ON unless the voltage on the gates of these transistors is brought below the threshold value for these transistors, as will be discussed below. The output signal is also provided to the non-inverting input of operational amplifier OA2, while the output of operational amplifier OA2 is provided to the gate of fourth NMOS transistor M16. A feedback value is supplied to the inverting input of operational amplifier OA2 utilizing PMOS transistors M8 and fourth and fifth NMOS transistors M16 and M9, with the feedback value taken from a fourth node N4 between fourth NMOS transistor M16 and fifth NMOS transistor M9. Fifth NMOS transistor M9 and seventh NMOS transistor M11 are sized proportionally to second NMOS transistor M7F, e.g., if second NMOS transistor M7F has a size 1000×1, fifth NMOS transistor M9 and seventh NMOS transistor M11 can have values of 10×1 and will then source one hundredth the current of second NMOS transistor M7F. During normal operation of ECU 400, fourth NMOS transistor M16 and sixth NMOS transistor M12 of forward current sensing circuit 404 detect the current through bus pin OUTx, including variations caused by data transmitted by the sensor, and forward current sensing circuit 404 provides a proportional current on both a first output node N7, which provides the proportional current Ircv, also known as a first current, to a processing circuit with a comparator to sense data sent from the sensor, and a second output node N8, which provides the proportional current IMrev, also known as a second current, to reverse current switching circuit 408. During a short to ground situation on bus pin OUTx, operational amplifier Opf regulates the current by limiting the voltage on the gate of second NMOS transistor M7F while NMOS transistor Mswitch remains ON.

Reverse current switching circuit 408 receives the proportional current IMrev at first node N9, which is coupled to VDD_LV through first current sink Csi1, so that the provided current is sinked at a constant rate. First NMOS transistor Mswitch is coupled between the gate of PMOS switching transistor Msn and VDD_LV; resistor R1 is coupled in parallel with first NMOS transistor Mswitch between the gate of PMOS switching transistor Msn and VDD_LV. The gate of first NMOS transistor Mswitch is coupled to a point between first node N9 and first current sink Csi1. During normal operation of ECU 400, the current IMrev provided at first node N9 is greater than the current sinked by first current sink Csi1 and the gate of first NMOS transistor Mswitch is held ON. With first NMOS transistor Mswitch ON, the gate of PMOS switching transistor Msn is coupled to VDD_LV, which works to hold PMOS switching transistor Msn ON. However, when a short to battery occurs, the second current IMrev at first node N9 becomes zero. This means that the voltage on first NMOS transistor Mswitch will drop as first current sink Csi1 sinks the current, allowing first NMOS transistor Mswitch to turn OFF. This in turn allows the gate of PMOS switching transistor Msn to rise, turning OFF PMOS switching transistor Msn. It is notable that in ECU 300, when a short to battery occurred, a reverse current could pass from bus pin OUTx through fifth NMOS transistor M9 and fourth NMOS transistor M16 and cause a current at first output node N7. However, with the addition of third diode D3, no back current is allowed, causing first current Ircv on first output node N7 and second current IMrev on node N8/N9 to become zero during a short to battery. The desired reverse current switching protection is thus supplied without the need for an additional sensing circuit, saving space and power by the design. An additional advantage can be provided by current sink Ioffset, which is coupled to the non-inverting input of operational amplifier OA2 through node N4. The offset current provided by this current sink allows the circuit to distinguish between a short to battery and a momentary cross current from high-voltage rail VDD_HV to medium-voltage rail VDD_MV, i.e., the current IMrev through node N8 is non zero for an open line and is zero for a short to battery. The current limit level for a short to battery can be adjusted using Ioffset value.

Figure 5:
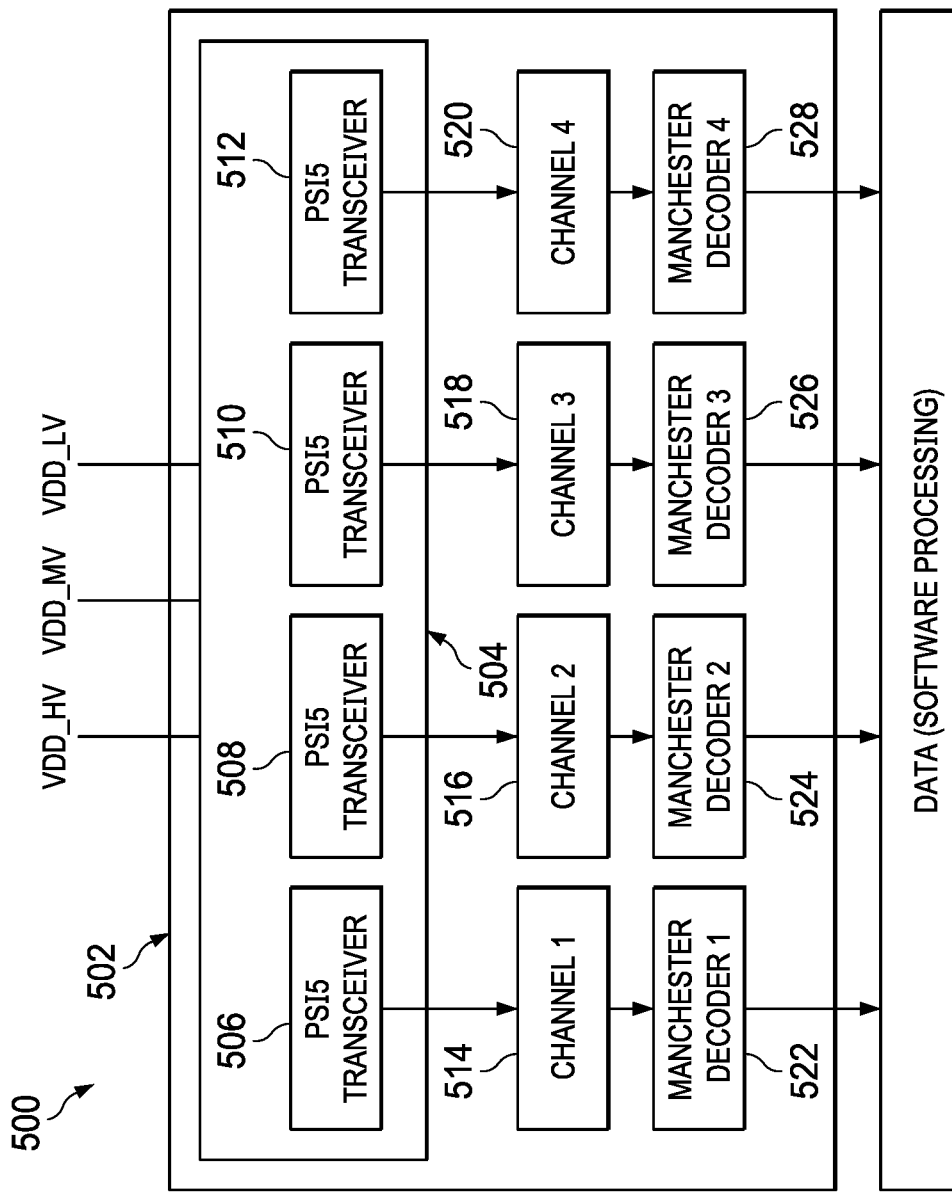
FIG. 5 depicts a high-level schematic of system containing a standalone PSI5 transceiver chip that can utilize the disclosed protection circuit according to an embodiment of the disclosure.

FIG. 5 depicts a high-level schematic of system 500 containing a standalone PSI5 transceiver chip 502 that can utilize the disclosed ECU for high-side driver circuit. PSI5 transceiver chip 502 receives three power supply inputs: VDD_HV that provides the high voltage, VDD_MV that provides a medium voltage and VDD_LV that provides a low voltage such as local ground. The three power supply inputs are coupled to a set of PSI5 transceivers 504, which are coupled to respective channels and decoders. Output from each of the channels of PSI5 transceiver chip 502 is provided to data module 530, which provides software processing of the received data. In the example shown, PSI5 transceiver chip 502 has four PSI5 transceivers and four channels, but it will be understood that there can be any number of channels provided as needed by the particular system in which the chip is utilized. PSI5 transceiver 506 is coupled to a first channel 514, which in turn is coupled to first decoder 522, which is a Manchester decoder; PSI5 transceiver 508 is coupled to second channel 516, which is coupled to second decoder 524; PSI5 transceiver 510 is coupled to third channel 518, which is coupled to third decoder 526; and PSI5 transceiver 512 is coupled to fourth channel 520, which is coupled to fourth decoder 528.

Figure 6:
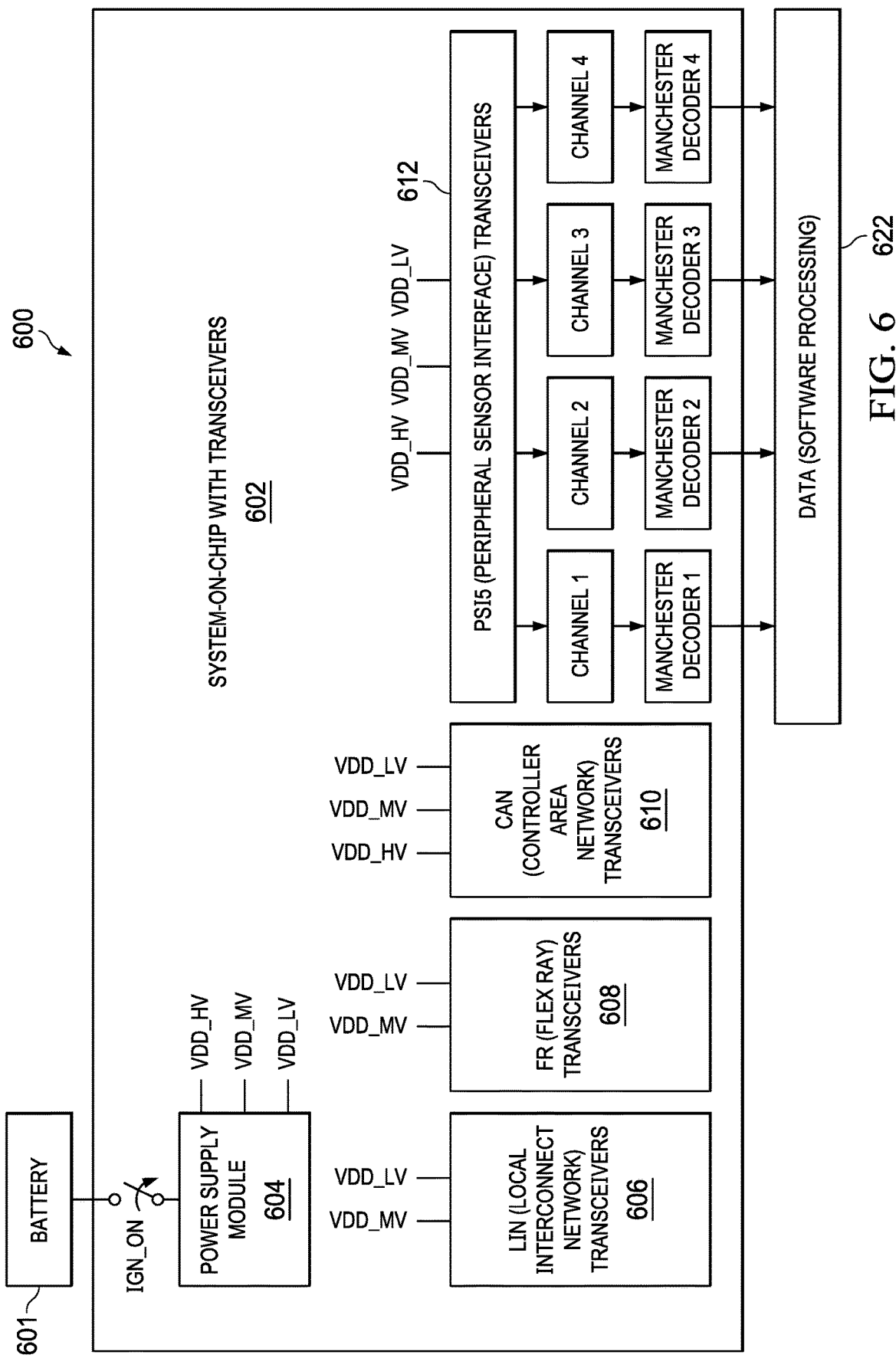
FIG. 6 depicts a high-level schematic of a system containing an SOC that can utilize the disclosed protection circuit according to an embodiment of the disclosure.

FIG. 6 depicts a high-level schematic of a system 600 including SOC 602 that can utilize the disclosed protection circuit according to an embodiment of the disclosure. SOC 602 is coupled to an automotive battery 601 and when the ignition is turned ON, power supply module 604 provides the power supply lines with high-voltage rail VDD_HV, medium-voltage rail VDD_MV and low-voltage rail VDD_LV. A number of transceiver systems can be provided on SOC 602 and in the example shown, these include LIN transceivers 606, which receive VDD_MV and VDD_LV, Flex Ray (FR) transceivers 608, which also receive VDD_MV and VDD_LV, Controller Area Network (CAN) transceivers 610 and PSI5 transceivers 612, both of which receive all three of VDD_HV, VDD_MV and VDD_LV. As in the stand-alone chip, PSI5 transceivers 612 includes four transceivers (not shown separately), each of which are coupled to a respective channel and decoder. The output of the decoders is provided to data software processing 622.

Applicants have disclosed an innovative circuit that protects the bus pin of a high-side driver from both a short to ground and a short to battery. The disclosed circuit utilizes less area on the chip and consumes less power because the circuit eliminates the need for a separate sensing circuit. The disclosed protection circuit can be utilized with a high-side drive for a PSI5 transceiver or with other high-side drivers. Both a stand-alone chip and an SOC that include the disclosed circuit have also been shown. Utilizing the disclosed protection circuit, a short to battery can operate to pass less than 10 mA of current.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An electronic control unit (ECU) for a high-side driver comprising:
    an amplifier circuit comprising a first switching transistor coupled in series with a second switching transistor between a first voltage rail that carries a first voltage and a second voltage rail that carries a second voltage that is less than the first voltage, the amplifier circuit being coupled to control respective gates of the first and second switching transistors; and
    a single current sense circuit coupled to protect a bus pin on the high-side driver from both a short to ground and a short to battery, the single current sense circuit comprising:
        an input node located between the first switching transistor and the second switching transistor;
        a switch circuit coupled to pass a current from the input node to the bus pin during normal operation;
        a forward current sensing circuit coupled to the input node and to the first voltage rail, the forward current sensing circuit being coupled to provide a first current on a first output node and a second current on a second output node, each of the first and second currents being proportional to an output current at the bus pin, wherein the first and second currents are substantially zero when a bus voltage on the bus pin is above a given value;
        a reverse current switching circuit coupled to receive the second current and further coupled to the gate of the second switching transistor, the reverse current switching circuit being coupled to turn the second switching transistor OFF when the second current output is zero; and
        a forward current protection circuit coupled to the forward current sensing circuit, to the first voltage rail and to a third voltage rail that provides a third voltage that is less than the second voltage, the forward current protection circuit being further coupled to turn OFF the switch circuit responsive to a short to ground.

2. The ECU for a high-side driver as recited in claim 1 wherein the second switching transistor is a P-type metal oxide silicon (PMOS) transistor and the reverse current switching circuit comprises:
    a first node coupled to receive the second current;
    a first current sink coupled between the first node and the third voltage rail;
    a first N-type metal oxide silicon (NMOS) transistor coupled between the gate of the second switching transistor and the third voltage rail, a gate of the first NMOS transistor being coupled to a point between the first node and the first current sink; and
    a first resistor coupled between the gate of the second switching transistor and the third voltage rail.

3. The ECU for a high-side driver as recited in claim 2 wherein the switch circuit comprises:
    a first current source coupled in series with a second resistor between the first voltage rail and the input node, the first current source providing a stable voltage on a second node; and
    a second NMOS transistor coupled in series with a third NMOS transistor between the input node and the bus pin, respective gates of the second and third NMOS transistors being coupled to the second node and further being coupled to a common source of the first and second NMOS transistors through a first diode and a second diode.

4. The ECU for a high-side driver as recited in claim 3 wherein the forward current sensing circuit comprises:
    a first PMOS transistor, a second PMOS transistor and a third PMOS transistor, each of the first, second and third PMOS transistors having a source coupled to the first voltage rail and having respective gates coupled together, a drain of the first PMOS transistor being coupled to a gate of the first PMOS transistor, a drain of the second PMOS transistor providing the first current and a drain of the third PMOS transistor providing the second current;
    a fourth NMOS transistor coupled in series with a third diode and a fifth NMOS transistor between the drain of the first PMOS transistor and a third node that is coupled between the respective sources of the second and third NMOS transistors, the fifth NMOS transistor having a gate coupled to the respective gates of the second and third NMOS transistors;
    a first operational amplifier having a non-inverting input coupled to the input node, an inverting input coupled to a fourth node between the third diode and the fifth NMOS transistor and an output coupled to a gate of the fourth NMOS transistor.

5. The ECU for a high-side driver as recited in claim 4 wherein the forward current sensing circuit further comprises a second current sink coupled between the fourth node and the third voltage rail.

6. The ECU for a high-side driver as recited in claim 4 wherein the forward current protection circuit comprises:
    a third resistor coupled in series with a sixth NMOS transistor, a fourth diode and a seventh NMOS transistor between the first voltage rail and the third node, a gate of the sixth NMOS transistor being coupled to the output of the first operational amplifier and a gate of the seventh NMOS transistor being coupled to the gate of the second NMOS transistor;
    a fourth resistor coupled in series with a third current sink (If_ref) between the first voltage rail and the third voltage rail; and
    a second operational amplifier having a non-inverting input coupled to a fifth node between the third resistor and the sixth NMOS transistor, an inverting input coupled to a sixth node between the fourth resistor and the third current sink and an output coupled to the respective gates of the second and third NMOS transistors through a fifth diode.

7. The ECU for a high-side driver as recited in claim 1 wherein the amplifier circuit comprises a floating amplifier.

8. The ECU for a high-side driver as recited in claim 2 wherein the amplifier circuit further comprises:
    an eighth NMOS transistor coupled in series with a fourth PMOS transistor (M21) and a second current sink between the first voltage rail and the third voltage rail;

a second current source coupled in series with a fifth PMOS transistor between the first voltage rail and the third voltage rail; and a third current source coupled in series with a sixth PMOS transistor, a terminal of the third current source being coupled to the first voltage rail and a drain of the sixth PMOS transistor being coupled to the gate of the second switching transistor, the fourth PMOS transistor having a gate coupled to a gate of the sixth PMOS transistor and to a drain of the fourth PMOS transistor and the gate of the first switching transistor being coupled to a node between the second current source and the fifth PMOS transistor.

9. The ECU for a high-side driver as recited in claim 1 wherein the first voltage is approximately 14 V, the second voltage is approximately 7 V and the third voltage is at local ground.

10. A transceiver chip comprising:
a plurality of decoders; and
a plurality of transceivers, each of the plurality of transceivers being coupled to a respective decoder of the plurality of decoders via a respective channel, a transceiver of the plurality of transceivers comprising an electronic control unit (ECU) for a high-side driver, the ECU comprising:
   an amplifier circuit comprising a first switching transistor coupled in series with a second switching transistor between a first voltage rail and a second voltage rail, the amplifier circuit being coupled to control respective gates of the first and second switching transistors; and
   a single current sense circuit coupled to protect a bus pin on the ECU from both a short to ground and a short to battery, the single current sense circuit comprising:
      an input node located between the first switching transistor and the second switching transistor;
      a switch circuit coupled to pass a current from the input node to the bus pin during normal operation;
      a forward current sensing circuit coupled to the input node and to the first voltage rail, the forward current sensing circuit being coupled to provide a first current on a first output node and a second current on a second output node, each of the first and second currents being proportional to an output current at the bus pin, wherein the first and second currents are substantially zero when a bus voltage on the bus pin is above a selected value;
      a reverse current switching circuit coupled to receive the second current and further coupled to the gate of the second switching transistor, the reverse current switching circuit being coupled to turn the second switching transistor OFF when the second current is zero; and
      a forward current protection circuit coupled to the forward current sensing circuit, to the first voltage rail and to a third voltage rail, the forward current protection circuit being further coupled to turn OFF the switch circuit responsive to a short to ground.

11. The transceiver chip as recited in claim 10 wherein the second switching transistor is a P-type metal oxide silicon (PMOS) transistor and the reverse current switching circuit comprises:
a first node coupled to receive the second current;
a first current sink coupled between the first node and the third voltage rail;

a first N-type metal oxide silicon (NMOS) transistor coupled between a gate of the second switching transistor and the third voltage rail, the gate of the first NMOS transistor being coupled to a point between the first node and the first current sink; and a first resistor coupled between the gate of the second switching transistor and the third voltage rail.

12. The transceiver chip as recited in claim 11 wherein the amplifier circuit further comprises:
an eighth NMOS transistor coupled in series with a fourth PMOS transistor (M21) and a second current sink between the first voltage rail and the third voltage rail;
a second current source coupled in series with a fifth PMOS transistor between the first voltage rail and the third voltage rail; and
a third current source coupled in series with a sixth PMOS transistor, a terminal of the third current source being coupled to the first voltage rail and a drain of the sixth PMOS transistor being coupled the gate of the second switching transistor, the fourth PMOS transistor having a gate coupled to a gate of the sixth PMOS transistor and to a drain of the fourth PMOS transistor and a gate of the first switching transistor being coupled to a node between the second current source and the fifth PMOS transistor.

13. The transceiver chip as recited in claim 10 wherein the plurality of transceivers are Peripheral Sensor Interface transceivers.

14. A system-on-chip (SOC) comprising:
a power supply module coupled to provide a first voltage rail that provides a first voltage, a second voltage rail that provides a second voltage that is less than the first voltage, and a third voltage rail that provides a third voltage that is less than the second voltage;
a first plurality of transceiver coupled to receive the second and the third voltage rails; and
a second plurality of transceivers coupled to receive the first, the second and the third voltage rails, each of the second plurality of transceivers being coupled to a respective decoder of a plurality of decoders via a respective channel, a transceiver of the second plurality of transceivers comprising an ECU for a high-side driver, the ECU comprising:
   an amplifier circuit comprising a first switching transistor coupled in series with a second switching transistor between the first voltage rail and the second voltage rail, the amplifier circuit being coupled to control respective gates of the first and second switching transistors; and
   a single sense circuit coupled to protect a bus pin on the ECU from both a short to ground and a short to battery, the single sense circuit comprising:
      an input node located between the first switching transistor and the second switching transistor;
      a switch circuit coupled to pass a current from the input node to the bus pin during normal operation;
      a forward current sensing circuit coupled to the input node and to the first voltage rail, the forward current sensing circuit being coupled to provide a first current and a second current, each of the first and second currents being proportional to an output current at the bus pin, wherein the first and second currents are substantially zero when a bus voltage on the bus pin is above a selected value;
      a reverse current switching circuit coupled to receive the second current and further coupled to the gate of the second switching transistor, the reverse current switching circuit being coupled to turn the second switching transistor OFF when the second current is zero; and a forward current protection circuit coupled to the forward current sensing circuit, to the first voltage rail and to the third voltage rail, the forward current protection circuit being further coupled to turn OFF the switch circuit responsive to a short to ground.

15. The SOC as recited in claim 14 wherein the second switching transistor is a P-type metal oxide silicon (PMOS) transistor and the reverse current switching circuit comprises:

a first node coupled to receive the second current;

a first current sink coupled between the first node and the third voltage rail;

a first N-type metal oxide silicon (NMOS) transistor coupled between a gate of the second switching transistor and the third voltage rail, the gate of the first NMOS transistor being coupled to a point between the first node and the first current sink; and a first resistor coupled between the gate of the second switching transistor and the third voltage rail.

16. The SOC as recited in claim 15 wherein the amplifier circuit further comprises:

an eighth NMOS transistor coupled in series with a fourth PMOS transistor (M21) and a second current sink between the first voltage rail and the third voltage rail;

a second current source coupled in series with a fifth PMOS transistor between the first voltage rail and the third voltage rail; and a third current source coupled in series with a sixth PMOS transistor, a terminal of the third current source being coupled to the first voltage rail and a drain of the sixth PMOS transistor being coupled a gate of the second switching transistor, the fourth PMOS transistor having a gate coupled to a gate of the sixth PMOS transistor and to a drain of the fourth PMOS transistor and a gate of the first switching transistor being coupled to a node between the second current source and the fifth PMOS transistor.

17. The SOC as recited in claim 14 wherein the second plurality of transceivers are Peripheral Sensor Interface transceivers.

* * * * *